US009992890B1

(12) United States Patent
Lukowski, Jr. et al.

(10) Patent No.: US 9,992,890 B1
(45) Date of Patent: Jun. 5, 2018

(54) MODULES AND SYSTEMS FOR DAMPING EXCITATIONS WITHIN FLUID-FILLED STRUCTURES

(71) Applicant: Raytheon Company, Waltham, MA (US)

(72) Inventors: Florian P. Lukowski, Jr., El Segundo, CA (US); Paul M. Shaheen, Manhattan Beach, CA (US); Charles Chu, Temple City, CA (US)

(73) Assignee: Raytheon Company, Waltham, MA (US)

( * ) Notice: Subject to any disclaimer, the term of this patent is extended or adjusted under 35 U.S.C. 154(b) by 0 days. days.

(21) Appl. No.: 15/372,275

(22) Filed: Dec. 7, 2016

(51) Int. Cl.
*H05K 7/20* (2006.01)
*F16F 7/104* (2006.01)
(Continued)

(52) U.S. Cl.
CPC ........... *H05K 5/0256* (2013.01); *F16F 7/104* (2013.01); *F16F 7/1017* (2013.01); *F16F 9/103* (2013.01);
(Continued)

(58) Field of Classification Search
CPC .. F16F 7/104; F16F 15/02; F16F 7/108; F16F 7/10; F16F 7/116; F16F 15/145; F16F 7/1005; F16F 7/1011; F16F 15/005; F16F 15/002; F16F 15/1421; F16F 15/022; F16F 15/04; F16F 15/1442; F16F 15/22;
(Continued)

(56) References Cited

U.S. PATENT DOCUMENTS 3,149,265 A 9/1964 Thorn
5,552,209 A 9/1996 McCutcheon
(Continued)

FOREIGN PATENT DOCUMENTS

CA 1070292 1/1980
EP 1151211 B1 3/2006
(Continued)

OTHER PUBLICATIONS

Automotive World; First combined inertial sensor with integrated vibration damper for ESP from Bosch; http://www.automotiveworld.com/news-releases/first-combined-inertial-sensor-with-integrated-vibration-damper-for-esp-from-bosch/; Nov. 16, 2012; 2 pages; United Kingdom.
(Continued)

*Primary Examiner* — Adam B Dravininkas

(57) ABSTRACT

A system or structure subject to external mechanical dynamic loading excitations propagated within the system or structure comprising a fluid filled structure and a fluid volume operable to facilitate fluid flow about at least part of the structure. Excitations within the structure can be propagated throughout. The system can further comprise a tuned mass damper (TMD) located within the fluid volume. The TMD can leverage the viscous properties of the fluid to attenuate the excitations within the structure. The TMD can comprise a mass and a spring operably connected to the mass. The TMD can further comprise a fluid resistance facilitating fluid flow about the mass and the spring for damping and a secondary tuning feature operably connected to at least one of the mass and the spring and the supporting fluid-filled structure.

9 Claims, 5 Drawing Sheets

(51) Int. Cl.
*H05K 5/02* (2006.01)
*F16F 9/32* (2006.01)
*F16F 7/10* (2006.01)
*F16F 9/10* (2006.01)
*F16F 15/023* (2006.01)

(52) U.S. Cl.
CPC .......... *F16F 9/3207* (2013.01); *F16F 15/023* (2013.01); *H05K 7/2039* (2013.01); *H05K 7/20154* (2013.01); *H05K 7/20263* (2013.01); *F16F 2222/08* (2013.01); *F16F 2222/12* (2013.01); *F16F 2230/06* (2013.01); *F16F 2234/08* (2013.01); *F16F 2238/04* (2013.01)

(58) Field of Classification Search
CPC ........ F16F 7/1017; F16F 15/023; F16F 9/103; F16F 9/3207; F16F 2238/04; F16F 2222/12; F16F 2230/06; F16F 2234/08; F16F 2222/08; H05K 5/0256; H05K 7/2039; H05K 7/20154; H05K 7/20263
See application file for complete search history.

(56) References Cited

U.S. PATENT DOCUMENTS

| | | | |
|---|---|---|---|
| 5,744,557 A | 4/1998 | McCormick et al. | |
| 5,775,472 A * | 7/1998 | Osterberg | F16F 7/10 188/378 |
| 5,816,373 A * | 10/1998 | Osterberg | F16F 7/1017 188/378 |
| 5,920,173 A | 7/1999 | Mercadal et al. | |
| 6,375,475 B1 | 4/2002 | Brodsky | |
| 6,429,510 B1 | 8/2002 | Moller | |
| 6,504,713 B1 | 1/2003 | Pandolfi et al. | |
| 6,557,675 B2 * | 5/2003 | Iannuzzelli | F16F 7/1028 188/380 |
| 6,657,858 B2 | 12/2003 | Rothschild | |
| 6,920,052 B2 | 7/2005 | Callahan et al. | |
| 7,461,728 B2 | 12/2008 | Huston et al. | |
| 7,477,527 B2 | 1/2009 | Suhir | |
| 8,303,267 B2 | 11/2012 | Nitta et al. | |
| 8,462,510 B2 | 6/2013 | Lin et al. | |
| 9,004,191 B2 | 4/2015 | Miller et al. | |
| 2002/0114317 A1 | 8/2002 | Pearson et al. | |
| 2003/0024781 A1 | 2/2003 | Iannuzzelli | |
| 2003/0188941 A1 * | 10/2003 | Davis | F16F 7/10 188/379 |
| 2007/0014418 A1 * | 1/2007 | Eatwell | F16F 7/1005 381/71.8 |
| 2007/0028885 A1 * | 2/2007 | Stothers | G05D 19/02 123/192.1 |
| 2009/0279246 A1 | 11/2009 | Nguyen et al. | |
| 2011/0290607 A1 * | 12/2011 | Teknos | B62D 37/04 188/379 |
| 2012/0287579 A1 * | 11/2012 | Lin | H01L 23/32 361/720 |
| 2013/0200248 A1 * | 8/2013 | Polzer | G01R 33/022 248/550 |
| 2014/0144528 A1 * | 5/2014 | Gilstad | F04B 53/001 137/528 |
| 2014/0145552 A1 | 5/2014 | Kihara et al. | |
| 2014/0202812 A1 | 7/2014 | Hauf | |
| 2015/0122605 A1 * | 5/2015 | Grossgebauer | F16F 15/1421 192/3.21 |
| 2015/0316123 A1 * | 11/2015 | Dogel | F16H 45/02 74/572.2 |
| 2016/0195154 A1 * | 7/2016 | Komiya | F16F 13/106 267/140.13 |

FOREIGN PATENT DOCUMENTS

| | | |
|---|---|---|
| EP | 1682792 B1 | 4/2011 |
| WO | WO 98/48197 | 10/1998 |
| WO | WO 2013/060555 A1 | 5/2013 |

OTHER PUBLICATIONS

International Search Report for International Application No. PCT/US2017/055439 dated Jan. 26, 2018, 16 pages.

* cited by examiner

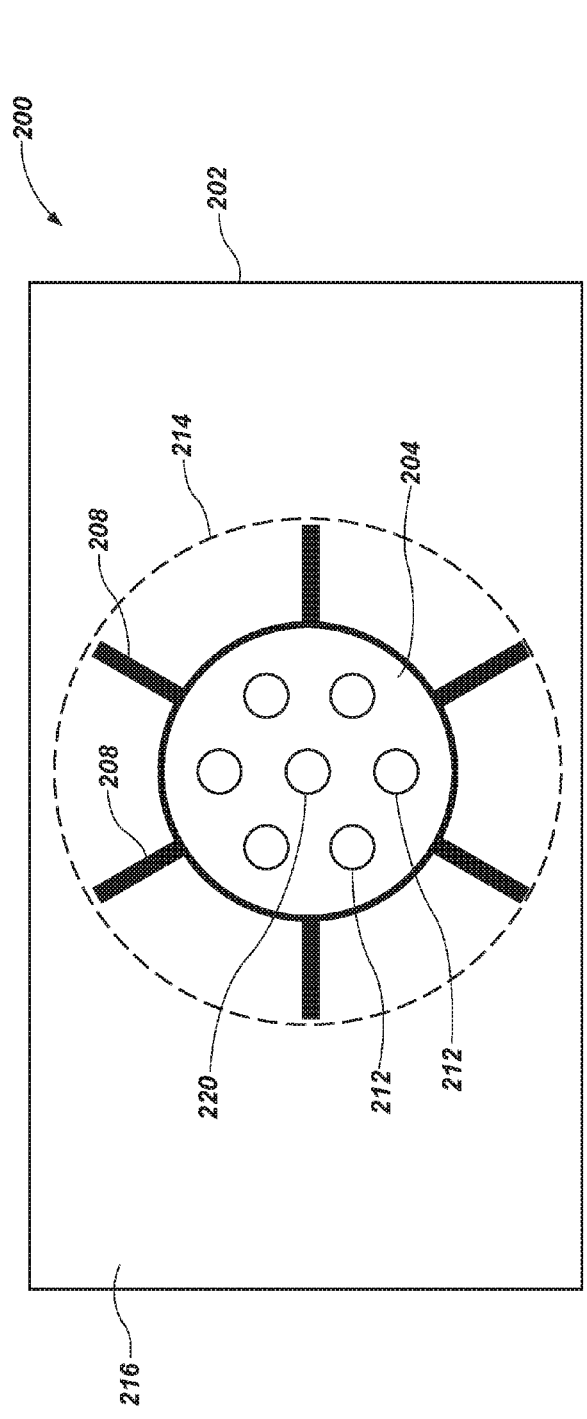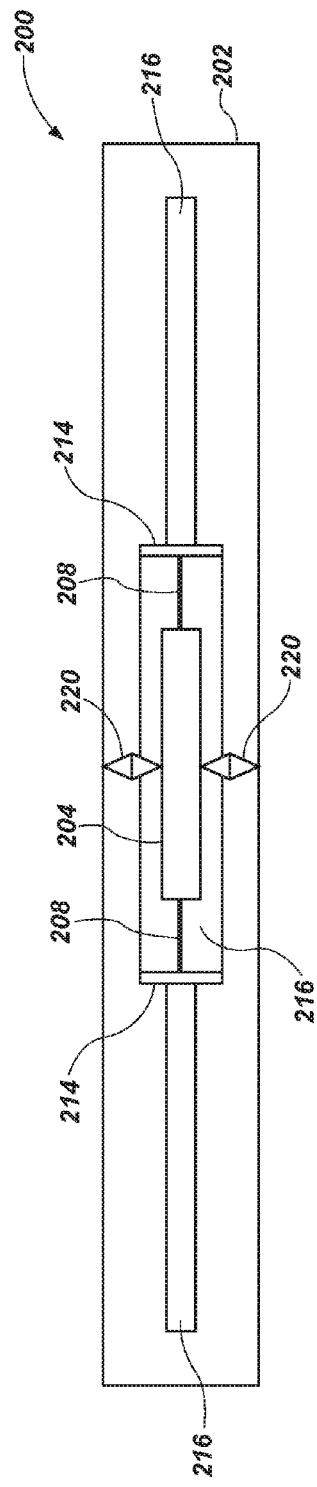

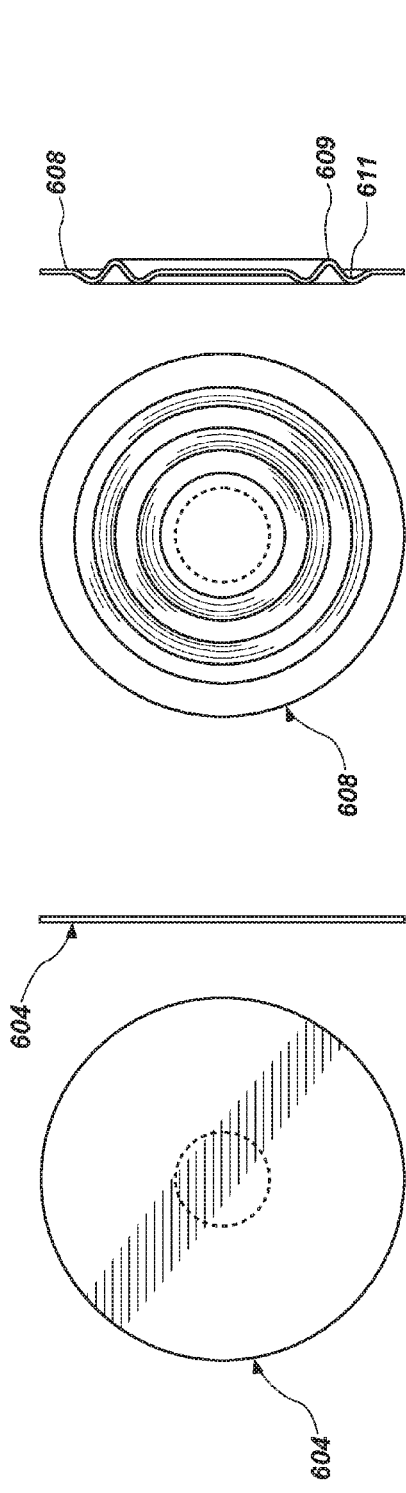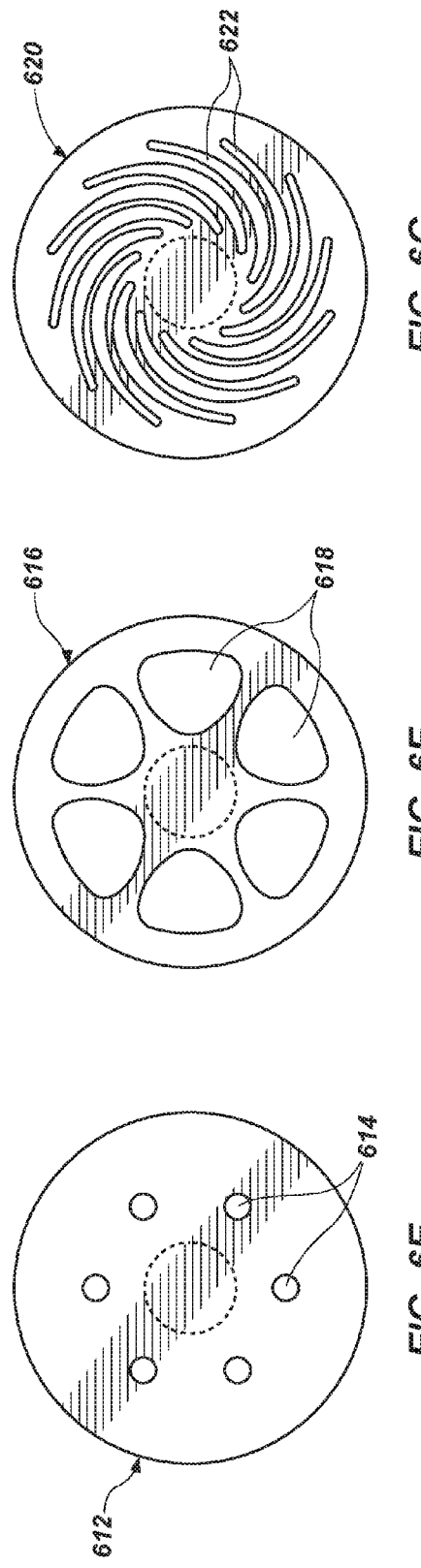
FIG. 6A
FIG. 6B
FIG. 6C
FIG. 6D
FIG. 6E
FIG. 6F
FIG. 6G

MODULES AND SYSTEMS FOR DAMPING EXCITATIONS WITHIN FLUID-FILLED STRUCTURES

BACKGROUND

Physical structures subjected to external mechanical dynamic loading environments will respond by vibrating themselves, such that significant strain energy can propagate through one or more components of the structures. To ensure the integrity of the system is maintained, there is a need to mitigate or attenuate this energy to ultimately prevent damage from such excitations. One particular example of such a physical structure is an electronics assembly having one or more printed wiring boards (PWB) that are mounted to a heatsink, and subjected to a vibration environment. These PWBs can contain many sensitive features, including soldered joints, electronic components, connectors, traces, etc., which all need to maintain their physical integrity for the system to perform as intended. If these sensitive features are subjected to vibration-induced strains that are high in magnitude and number of cycles, then failures can occur in the form of cracks and disconnections, rendering the system inoperable. The same may be said of other primary structures in addition to electronics assemblies.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIG. 2A illustrates a detailed-level orthotropic top view of a TMD in a fluid filled structure according to an example of the present disclosure;

FIG. 2B illustrates a detailed-level orthotropic side view of the structure and TMD of FIG. 2A;

FIGS. 6A-6G illustrate various detailed-level front and side views of different example flexure-type springs for use within a TMD in accordance with examples of the present disclosure.

Figure 1:
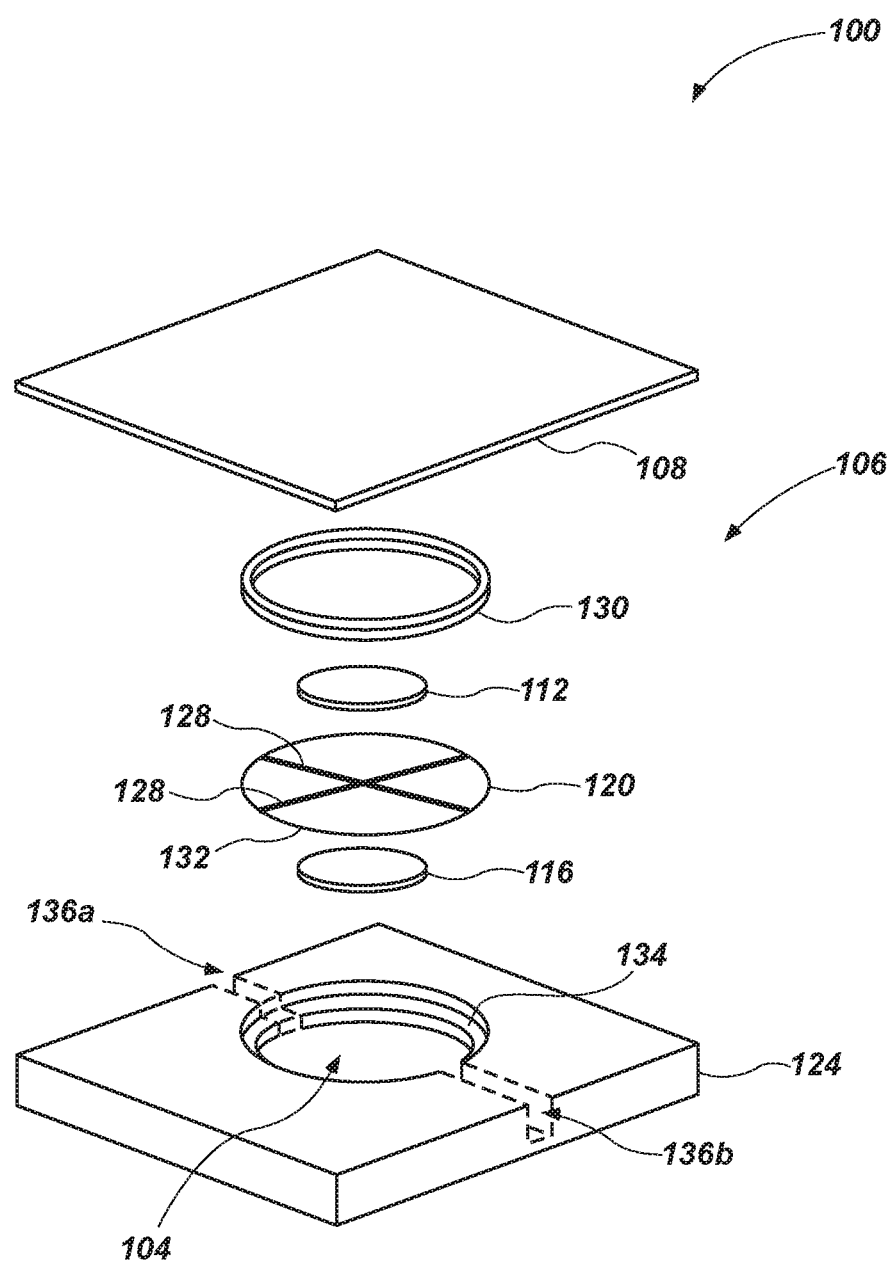
FIG. 1 illustrates a detailed-level isometric exploded view of a primary structure containing the individual components of a tuned mass damper (TMD), an auxiliary damped absorber system, in accordance with one example of the present disclosure.

Reference will now be made to the examples illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of technology examples is provided below and then specific technology examples are described in further detail later. This initial summary is intended to aid readers in understanding the technology more quickly but is not intended to identify key features or essential features of the technology nor is it intended to limit the scope of the claimed subject matter.

Generally speaking, the present disclosure sets forth a system of robust multi-band dynamic absorbers that mount internal to a liquid-filled primary or base structure (e.g., an electronics module or assembly, electronic chasses and housings, structural members (such as bulkheads, cold walls), heat exchangers, radiators (such as land vehicle, watercraft, spacecraft and aircraft radiators), liquid pump housing assemblies, pipes, hoses, pumps, accumulators, valves, manifolds, liquid distribution networks, impeller/propellers, liquid cooled or lubricated engines, reduction gear assemblies, stators, various liquid reservoirs, fuel tanks, and others) and that leverage the viscous properties of the fluid for the purpose of significantly damping out excitations or vibrations, such as to ultimately reduce the potential of hardware damage. For example, electronic modules containing Printed Circuit Board(s) (PCB) or Printed Wiring Board(s) (PWB), and/or Circuit Card Assemblies (CCA) can be exposed to harsh vibration environments, which can cause the sensitive electronic components and their connecting solder joints to fail abruptly under high shock loads, or fatigue over many cycles at lower vibration levels and ultimately fail over time. These modules typically do not have much space available to allow for the addition of stiffening structures or other features to help mitigate the vibration-induced damage, and thus frequent damage and/or failure can occur.

An auxiliary system, or tuned mass damper (TMD), can be introduced to mitigate this energy by damping or controlling the amplitude of vibration of the primary structure, and thereby reducing its risk of failure. Fluid-filled structures provide the opportunity to leverage the natural damping properties of the fluid, and introduce such an auxiliary damped absorber system that can effectively protect the primary structure. In a given fluid-filled structure, one or more dynamic absorbers or tuned mass dampers (TMD) can be mounted inside the structure. In one aspect, each of these TMDs can be positioned at optimum anti-node locations, to ultimately mitigate high vibration environments across multiple frequency ranges. A TMD can consist of one or more masses (e.g., a material having a desired configuration and density), a primary spring or spring-like system (e.g., flexures or similar compliant members) made of a durable material that attach the mass(es) to the primary or base structure with a pre-determined stiffness, a damper or damping system (which can introduce viscous damping through the forced flow of fluid through one or multiple orifices in the mass, and/or around the mass perimeter, or similar), and, optionally, a secondary tuning spring or spring system that can function to attach the mass to the structure, and which can be configured to facilitate fine tuning of the TMD stiffness after installation (e.g., using preloads accessible through the outer primary structure's walls). Moreover, one or more components of a TMD can be readily varied or adjusted to provide the requisite vibration absorbing properties for the given application. Utilizing one or more TMDs as described herein can function to reduce the vibration response of the structure when in a sufficiently high vibration environment.

An example of a device for damping vibrations can comprise a fluid-filled primary or base structure, a fluid volume and a tuned mass damper (TMD) that mounts internally within the structure to leverage the properties of the fluid for damping purposes. The fluid volume can be operable to facilitate fluid flow about at least part of the fluid-filled structure, wherein excitations within the fluid-filled structure are propagated in the fluid volume. Fluid "flow" can be defined as any type of movement of the fluid within the fluid volume (e.g., the fluid volume can comprise a channel, reservoir, etc.) relative to a TMD and a fluid channel or reservoir. This can include continuous fluid flow within a fluid channel, fluid that at least partially fills and moves within a reservoir, static fluid, or any other arrangement wherein the fluid is caused or permitted to move relative to one or more TMD components. As such, the TMD is intended to be located internal to the structure and within the fluid volume, thus being subjected to the fluid dynamics of the system. In other words, the TMD can leverage the viscous properties of the fluid and associated drag forces to help attenuate excitations or vibrations within the primary structure without occupying locations external to the fluid volume. As discussed herein, "leveraging" can mean using or relying on or benefitting from the fluid within the fluid reservoir as it interacts with the TMD. Stated differently, leveraging can mean utilizing the intrinsic drag and/or damping properties of the fluid to provide the TMD with damping or attenuation capabilities with the fluid acting on the TMD. In an example, acting on the TMD can mean movement of the fluid resulting in application of a force to at least one of the mass and spring of the TMD, wherein energy is transferred between system components to facilitate a damping function for the primary structure.

An example TMD applicable for use with multiple systems and which can comprise different configurations as discussed herein can comprise a mass, a spring operably connected to the mass, and a fluid resistance component or feature facilitating fluid flow about and/or through the mass and the spring for damping. The TMD can also include a secondary tuning feature operably connected to at least one of the mass and the spring. As such, the TMD systems described herein can be further tuned for optimization of one or more of the system parameters (e.g., mass, stiffness, and damping) by modification of one or more of the components thereof in combination with the structure associated with the TMD.

With reference to FIG. 1, a detailed-level isometric exploded view, an exemplary primary structure 100 includes a body portion 124 having a fluid volume 104 formed therein. The primary structure 100 can be operable with a tuned mass damper (TMD) 106 configured to be received and to function within the fluid volume 104. The primary structure 100 can further include a facesheet (e.g., facesheet closeout panel) 108 operative to at least partially define (e.g., cover or otherwise provide a boundary of) the fluid volume 104 and the TMD 106. The TMD 106 can include a spring and mass arrangement or assembly. In this example, the mass can include two separate elements, namely a first mass 112 and a second mass 116. The first and second masses 112, 116 can be operatively situated adjacent to a spring 120. In one aspect, the masses, 112, 116 can be attached to the spring 120, such as by way of screws or another retaining or fastening mechanism to create the spring/mass assembly. Additionally, the spring 120 can be retained within the primary structure 100 and the body portion 124 that defines, at least in part, the fluid volume 104. Here, the body 124 includes a shoulder 134 recessed below an upper surface, at least a portion of the spring 120 being configured to be seated about the shoulder 134, or in other words, the shoulder 134 being sized and configured to receive at least a portion of the spring 120. In this manner, the spring/mass assembly can be property seated within the primary structure 100, with the spring resting on the shoulder 134.

In this example, the spring 120 is configured as having multiple radial extensions 128 extending between opposing sides of a circumferential or outer rim portion 132. The radial extensions 128 of the spring 120 and its corresponding spring constant, in combination with the circumferential or outer rim portion 132 and the masses 112, 116 can combine to result in a local auxiliary dynamic system with a specific eigenvalue, or natural frequency, of the TMD 106, which can affect the dynamics of the primary structure 100 and can facilitate dampening of unwanted excitations present within the primary structure 100. In other examples, the spring 120 can be a flexure consisting of a thin solid member, which can have a planar or nonplanar configuration, can contain cut-outs of various shapes and sizes, comprise extensions that are curved radially (e.g., spiral-like). Optional holes or orifices (not shown in FIG. 1) located in the spring 120 and/or masses 112, 116 can provided the requisite damping for the TMD 106 to dynamically behave as needed.

As shown, a spacer 130 can be used to retain the spring 120 in proper alignment and/or position within the body 124 and can provide proper fixity to the spring 120. In this and other examples herein, the spacer 130 can have an interference fit or a slip fit in relation to the body 124. Indeed, the spacer 130 can be press fit into the diameter of the fluid volume 104, therefore restraining the spring/mass assembly. Once the TMD 106 is in place, the facesheet 108 can be brazed, bonded, welded, soldered, or otherwise secured or coupled on or to the assembled TMD 106 to create the final sealed enclosure.

The spacer 130 can serve to support the operating position of the TMD 106, and specifically the spring 120, within the primary structure 100, including in an out-of-plane position. In one aspect, the spacer 130 and shoulder 134 can together function to fix the position of the spring and masses in a neutral position within the structure 100. It is to be understood, as discussed elsewhere herein, that those skilled in the art will understand and realize the many different configurations or arrangements of mass(es) and spring(s) that are possible to create various static and dynamic system characteristics for a given application.

Further with respect to this example, the primary structure's body 124 can include one or more channels (e.g., see channels 136a and 136b shown in dotted lines indicating that the one or more channels are optional) that can facilitate fluid flow into the fluid volume 104. For example, in one aspect, the body 124 can comprise a standalone configuration with no channels leading into or out of the fluid volume 104. Alternatively, in another aspect, the body 124 can comprise a periphery configuration with a single fluid channel formed in the body 124 and in fluid communication with the fluid volume 104 (see either of fluid channels 136a or 136b, each of which could represent this concept. In still another aspect, the body 124 can comprise an in-line configuration with multiple fluid channels formed in the body 124, each in fluid communication with the fluid volume 104 (e.g., in this aspect, the body 124 would have formed therein both of the fluid channels 136a and 136b). The dotted lines are used merely to represent different optional configurations of the body 124. In essence, fluid channels facilitate the supply and/or return of fluid returned from a source external to the structure 100. In other words, the fluid volume can be in fluid communication with a fluid source external to the fluid-filled structure via one or more fluid channels.

It is to be understood that the body can be formed of various materials, including, for example, aluminum, steel, other metals, and alloys thereof, polymers, elastomers, other non-metallic and/or composite materials (such as carbon fiber or natural materials), ceramics, glasses and others, as will be recognized by those skilled in the art. The spacer, mass, spring, and facesheet can similarly be made of one or more materials, such as those listed above as with respect to the body portion.

The spring used in examples of TMDs described herein can comprise different types, including flexures, leaf springs, coil springs, Belleville washers, tension, compression or shear springs, linear and non-linear, and others having suitable spring rates, stiffness, packaging and functionality as one of ordinary skill in the art would appreciate. As discussed, an example spring operable with examples described herein can comprise a circumferential or outer rim or band with one or more radial extensions extending outward or inward therefrom. The spring can be operably connected to the mass at one portion thereof and to the primary structure, containing the TMD, at another portion. Additionally, it is to be understood that a spring can include multiple members to create a single spring mechanism. In other embodiments, the spring can be a flexure consisting of a thin solid member, which can have a planar or nonplanar configuration, can contain cutouts of various shapes and sizes, and/or can comprise extensions that are curved radially (e.g., spiral-like). Optional holes or orifices located in the spring and/or masses can provided the requisite damping for the TMD to dynamically behave as needed. Further, a spring member can be arranged to react in-plane or out-of-plane, symmetrically or asymmetrically.

Examples of the mass used in a TMD such as described herein can be configured in a variety of arrangements including a disk, a plate, another substantially flat shape, or a taller shape with a larger aspect ratio including a curved form or one having a substantially non-planar shape. Other examples of a mass can include an arrangement of a blunt shaped mass, such as a rectangular prism, or other such shapes that interact with the surrounding enclosure to facilitate a fluid resistance together with the spring in the TMD. Additionally, it is to be understood that multiple components can be used together to create a composite mass for the TMD system. For example, two disks may be arranged to cooperate with multiple spring elements to create a single mass around the spring elements. Similarly, the spring elements can cooperate with the mass elements to create or modify the individual spring element characteristics to create a given system spring characteristic. In addition, the mass(es) and spring(s) can be separate parts joined together, one integrated part and multiple combinations and permutations thereof.

The TMD can provide a fluid resistance by leveraging the properties of the fluid flow about the TMD, and the design and arrangement of the mass and spring together with the TMD enclosure (i.e., the surrounding structure) can define, at least in part, a damping characteristic or property capable of attenuating to a designed degree of excitations within the system. A property of the fluid damped systems is a damping coefficient defined by many interacting variables. Some of these variables can include the viscosity of the fluid and flow characteristics of the fluid at the various operating temperatures and pressures. Other such variables can include the relative flow restriction(s) present within the damping system. In some cases, the relative flow restriction(s) can be influenced by the design and arrangement of the TMD spring(s) and the mass(es), as well as the structure in support of these. Additionally, the structure containing the TMD can have a natural resonant frequency. This resonant frequency can be determined by analysis or testing. In some examples, the TMDs can be located at one or more antinodes corresponding to one or more Eigen modes of the systems.

Detailed-level orthotropic views of another example primary fluid-filled structure containing a TMD is schematically depicted in FIGS. 2A and 2B, with top and side views shown respectively. The system 200 shown includes a mass system 204 and a spring system 208. Several apertures or orifices 212 are defined within the mass 204 and/or between spring members 208. These can be sized and configured (i.e., tuned) as needed to assist in adjusting the damping coefficient of the TMD. A spacer 214 can operatively locate the spring 208 relative to the primary structure 202. The system 200 can further include fluid 216 operable with other components of the system 200. It is to be understood that the fluid 216 can be disposed within the fluid volume of the structure 202 or circulating through the structure 202 via flow paths (not shown) internal to the system 200 as well as external thereto. Further, the configuration of the structure 202 can accommodate additional flow paths as will be appreciated by one of skill in the art. In one example, walls or wall portions of the fluid-filled structure 202 can function to form flow channels within the structure 202. Fluid in the system 200 can interact with the orifices 212 in the mass and/or the gaps between spring members 208. In examples, orifices 212 can be symmetrically or asymmetrically placed in the mass 204 and/or between the springs 208, and can be present in any number or not at all in other alternative examples. It is to be understood that various orifice arrangements can be used with any of the examples of TMDs disclosed herein. In one example, an orifice 212 may define flow through the mass 204 and/or between spring 208 component(s) in one or more directions.

As shown in FIG. 2B, a spacer 214 can be used to retain the spring 208 in proper alignment and/or position within the body 202 and can provide proper fixity to the spring 208. In this and other examples herein, the spacer 214 can have an interference fit or a slip fit in relation to the body 202. The spacer 214 can be press fit into the diameter of the cavity of the body 202, therefore restraining the spring/mass assembly. Once the TMD 200 is in place, a closeout can be brazed or bonded onto the assembly to create the final sealed enclosure.

Additionally, as shown in this example, a secondary tuning feature 220 can be operatively connected to one or both sides of the mass 204 and the body structure 202 supporting the TMD. Examples of TMD systems as disclosed herein can comprise a secondary tuning feature operative to tune the dynamic properties of the TMD by fine tuning the TMD stiffness. This can be accomplished by limiting the distance the mass(es) 204 of the TMD are allowed to displace and/or effectively adding preloads to the springs 208 as the TMD functions. The secondary tuning feature can be any type of arrangement wherein the TMD is fine-tuned by way of an operative connection of the TMD and the TMD enclosure (e.g., the structure supporting the TMD). In an example, the secondary tuning feature(s) 220 can comprise a screw and/or secondary spring and/or other actuator operatively connected to the TMD enclosure (structure) and to the mass(es) and/or spring 208 of the TMD. The TMD and the secondary tuning feature 220 can be configured such that the secondary tuning feature 220 is adjustable from outside of the structure 202 containing the TMD, and as such, the structure 202 can comprise suitable means for retaining and facilitating movement of the secondary tuning feature 220, such as an aperture for receiving a screw and for providing access to the screw by a user. As such, the secondary tuning feature 220 can be calibrated and modified after assembly of the system. In an example, the secondary tuning feature 220 can include a set screw and/or secondary spring and/or linear actuator engageable with the mass(es) 204 that provides an adjustment to tune the TMD's dynamic behavior.

Figure 3:
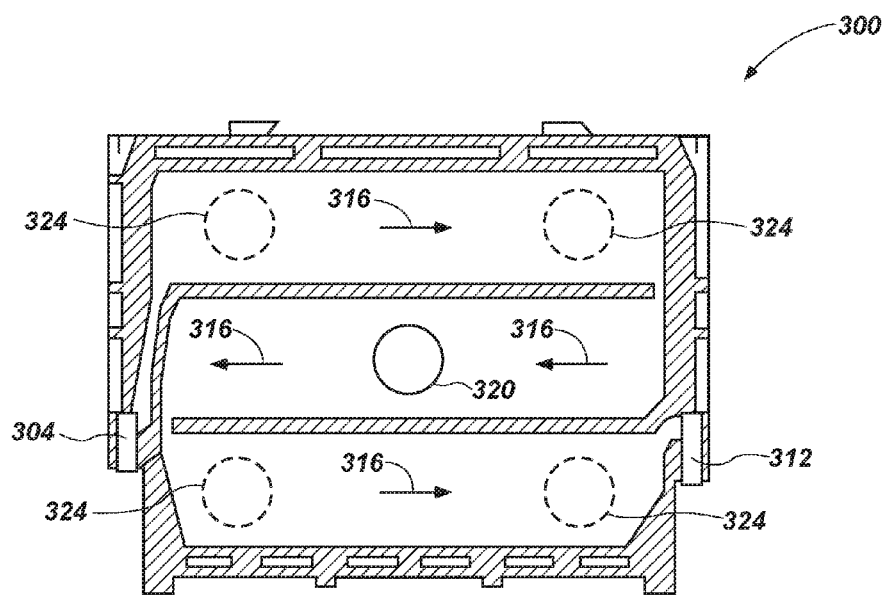
FIG. 3 illustrates an assembly-level top view of a structure with one or more TMDs in accordance with another example of the present disclosure.

The arrangement of spring(s) and/or mass(es) can allow a TMD to operate within a variety of applications. One example application is shown in FIG. 3 (discussed also further below). The TMD can be operatively positioned and supported between a printed wiring board (PWB), or a first component, and another or second component of a primary structure in the form of an electronics module. The other component can be another PWB, a structural element (e.g., a substantially plate-like component) used to facilitate the retention of fluid, such as in a fluid volume formed in the structural element, or another component. It is to be understood that the TMD can be mounted at various locations relative to the first and second components of the electronics module (or other application), and it is not necessary, or in some cases, even desirable, to mount the TMD in close proximity to a heat generating element. It is to be further understood that example TMDs according to the present disclosure can be used in other applications as well.

It is contemplated that a TMD can be functional within a variety of different types of fluid volumes. One example fluid volume can define a fluid reservoir configured to receive circulating fluid. The reservoir can comprise one or more inlet/outlet channels for facilitating fluid flow, wherein one or more TMDs can be located within the fluid flow path (e.g., see the example of FIG. 3). Another type of fluid volume can comprise a fluid reservoir having only one inlet, such that fluid can enter therein and operate with the TMD, but not necessarily (but possibly) circulate therethrough. Still another type of fluid volume can comprise a fixed and sealed, or self-contained volume of fluid, with the TMD supported or mounted therein. Those skilled in the art will recognize that a fluid-filled structure can comprise a variety of different fluid reservoir configurations, as well as different fluid flow dynamics in relation to the fluid reservoirs.

In one particular example, an electronics module can include at least one PWB and a heatsink or other support structure mounted external to the PWB for cooling and/or supporting the PWB. The heatsink can comprise at least one facesheet that at least partially defines (provides a boundary for) a fluid reservoir. Fluid can be operable to flow within the fluid reservoir. A TMD can be located away from the PWB and mounted internally within the heatsink, and particularly within the fluid reservoir of the heatsink. The TMD can leverage the viscous properties of the fluid flowing within the fluid reservoir to attenuate vibrations or excitations within the electronics module. The TMD can be at least partially enclosed by the facesheet. The fluid reservoir can comprise a primary fluid flow path and a secondary fluid flow path in fluid communication with the primary fluid flow path. A TMD can be located in one or both of the primary fluid flow path and the secondary fluid flow path. Although the example provided here discusses the fluid reservoir included within a heatsink, or at least partially defined by a heatsink, this is not intended to be limiting in any way. As indicated above, the TMD can be supported within the electronics module at a variety of locations, wherein structural elements of the electronics module define a fluid reservoir housing or permitting flow of a fluid.

It is to be understood that the fluid can comprise any type of fluid (gaseous or liquid) that can interact with the TMD to enable the TMD to provide vibration attenuation capabilities. In the example of an electronics module, the fluid can comprise a type of coolant.

An electronics module can comprise a plurality of TMDs mounted to a heatsink within a fluid reservoir proximate one or more Eigen mode, or natural frequency mode shape, antinodes. It is to be understood that proximate in this context allows for variability from a defined position. Proximate can be near, substantially near, or distanced from any Eigen mode antinode. The structural loading conditions and constraints placed thereon can define characteristics of Eigen mode nodes and antinodes for any given structure. The location of the TMDs can be placed to optimize their effectiveness in damping select modes or multiple vibration modes, and allow for packaging, assembly and/or other concerns.

In the example of an electronics module, the fluid volume of a structure can comprise a fluid that can facilitate damping of vibrations within the electronics module, in addition to performing a cooling function. Therefore, cooling channels can serve as fluid flow channels for the damping dynamics. For example, FIG. 3 depicts an assembly-level top view schematic of an electronics module 300 comprising a heat sink having a fluid reservoir in the form of multi-directional cooling channels formed therein, and further comprising various TMDs mounted at select locations within the cooling channels. The electronics module 300 comprises an inlet 304 for fluid to enter and an outlet 312 for the fluid to exit, following a flow direction as indicated by arrows 316 through the fluid reservoir. It is to be understood that the TMDs can be positioned in any strategic orientation relative to a fluid flow direction. Indeed, the mass and spring of a TMD can be oriented transverse to the fluid flow in any degree of inclination. In most cases, the TMD will be mounted such that its mass(es) will exhibit maximum displacements predominantly along an axis normal to the major plane of the primary structure, which is orthogonal to the fluid flow direction. Of course, those skilled in the art will recognize that different orientations can provide different damping characteristics.

As shown in FIG. 3, the TMD 320 can be located at an Eigen mode antinode of the module 300. Of course, this is not intended to be limiting in any way as the TMD 320 can be mounted elsewhere within the fluid flow path. Optionally, there can be one or more additional TMDs (here shown in dashed lines as TMDs 324) mounted within the fluid volume at other locations, including other higher-order Eigen mode antinodes of the module 300. As such, it is to be understood that the TMDs can provide for multi-band damping of structures.

Manufacturing approaches to the systems and components described herein can vary widely. One example of a manufacturing approach includes brazing, welding, soldering or bonding a facesheet to a machined solid base plate defining the fluid volume and various other structural features. Some of those features can include a shoulder for a spring of a TMD to be seated upon as a spacer is press fit on top thereof. Other features may include various flow channels in line with examples described elsewhere herein. For example, the machined solid base plate may include an assortment of twists and turns for the fluid to travel through in order to interact with the TMD(s) and also in some cases to facilitate effective heat transfer from the system.

Another manufacturing approach useful with examples disclosed herein is additive manufacturing or three-dimensional printing. Those of skill in the art will appreciate the variety of structures enabled by such technology as useful with the TMDs disclosed herein. For example, the TMD(s) can be incorporated directly into the printing process using selective laser melting (SLM) or electron beam melting (EBM). One more example of a manufacturing approach contemplated for examples according to the present disclosure includes ultrasonic welding. Further manufacturing approaches will be apparent to those of skill in the art.

Figure 4:
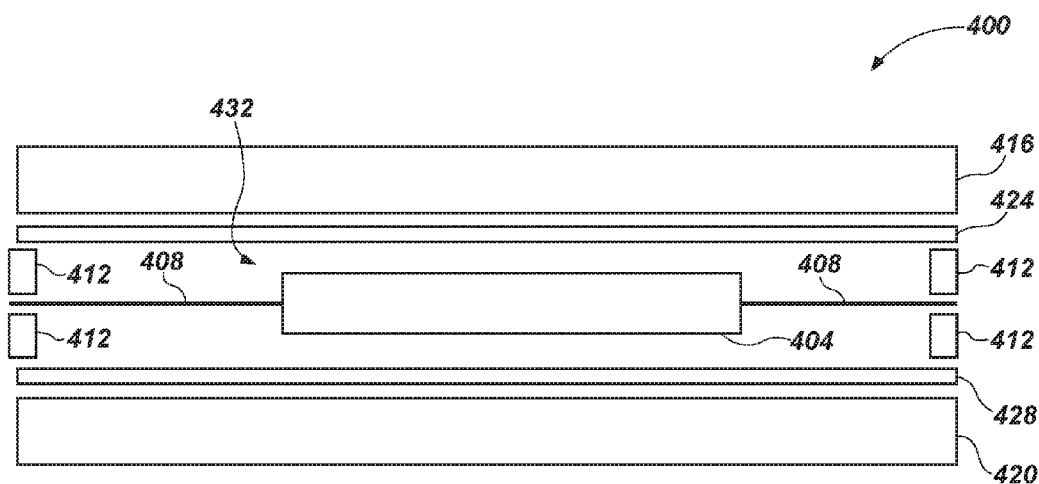
FIG. 4 illustrates an assembly-level side view of a structure having a TMD in accordance with an example of the present disclosure.

With reference to FIG. 4, an assembly-level side view, a TMD system 400 of another example is depicted, shown in a partially exploded view. The TMD system 400 can comprise a fluid-filled system, and can comprise one or more TMDs having a mass 404, a spring 408, and optionally a secondary tuning feature (not shown). The system 400 can further comprise a supporting fluid-filled structure defining a wall having various wall portions 412, and two facesheets 416 and 420 brazed to the wall portions 412 using a brazing material represented as 424 and 428. In this example, the walls can be formed to define, at least in part, a fluid volume 432. The mass 404 and spring 408 can be formed so as to mount within the system 400, and particularly within the fluid flow in fluid volume 432, with the spring 408 being retained by the walls and operatively connected to the mass 404. Specifically, as shown in FIG. 4, the spring 408 may be retained between adjacent wall portions 412. The fluid volume 432 can comprise a series of channels within a larger system (e.g., an electronics module or any structural system). It is to be understood that the walls or components of the walls (e.g., wall portions 412, facesheets 412 and 416, and/or brazing sheets 424 and 428) can be machined from solid material or otherwise formed to create the fluid volume, including any channels or flow passages therethrough.

Figure 5A:
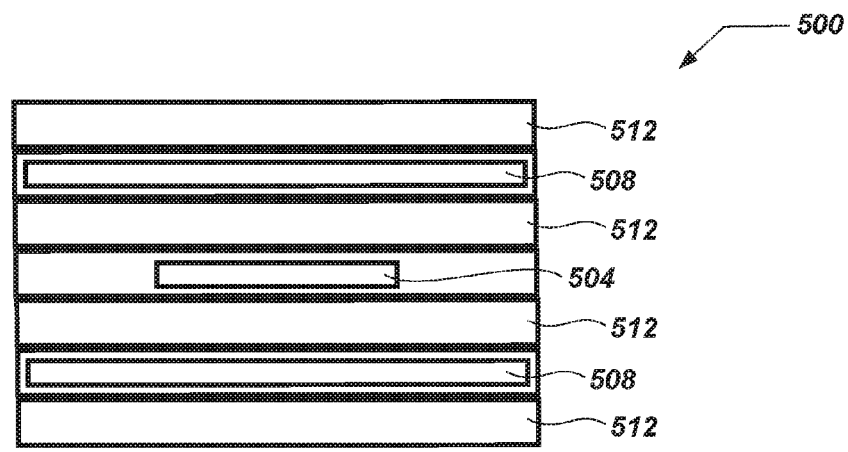
FIGS. 5A-5O illustrate an assembly-level side view of various configurations of structures having one or more TMDs in accordance with different examples of the present disclosure.
Figure 5B:
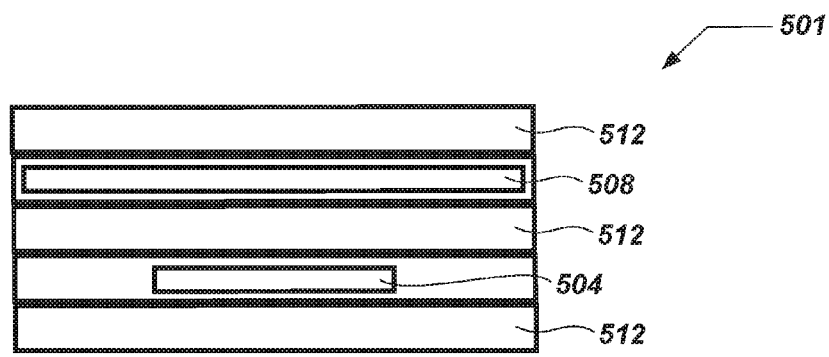
Figure 5C:
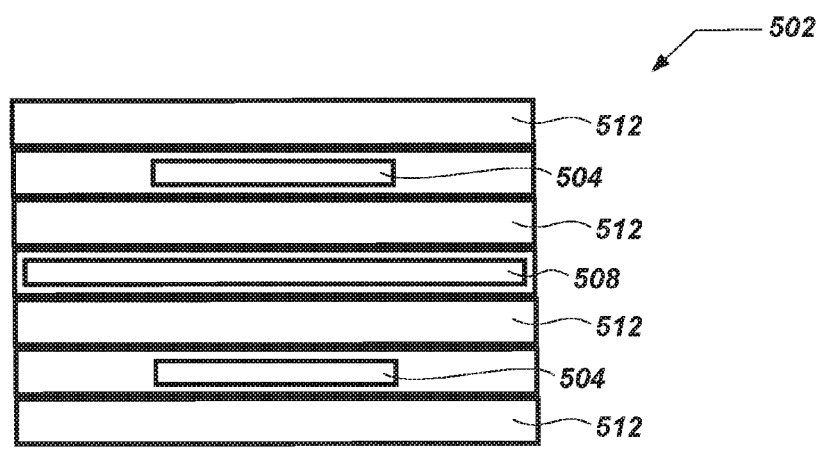

Similar to the example TMD systems described above, the system 400 can be deployed within an environment where it may be subject to vibrations or excitations, which can be propagated throughout the system. As the vibrations or excitations are propagated through the primary structure, the TMD can function to attenuate such vibrations or excitations by leveraging the viscous properties of the fluid within the system. The fluid volume can be operable to facilitate fluid flow about at least part of the structure and the TMD, such that the fluid impinges upon the TMD activating the displacement of the mass(es) and the spring, and thus damping the vibrations or excitations within the structure FIGS. 5A-5C depict various assembly-level side views of example structures 500, 501, 502, respectively, each having one or more TMDs. It is to be understood that each TMD can be configured similar to other TMD examples disclosed herein. In the examples shown, one or more TMDs 504 can be operatively connected in a multilayer structure including components 508 that generate heat. The TMDs can be located in a variety of configurations relative to the heat generating components. For example, in FIG. 5A, a TMD 504 is located between two heat generating components 508, which are supported by structural members 512. In FIG. 5B, a TMD 504 is located adjacent a heat generating component 508, with structural members 512 thereabout. In FIG. 5C, two TMDs 504 are located about a single heat generating component 508, with structural members 512 thereabout. Various other arrangements are contemplated herein as will be appreciated by one of skill in the art.

FIGS. 6A-6G depict various top and side views of example flexure-type springs for use within a TMD, with each example depicting possible spring features used in the TMDs. It is to be understood that a spring configuration of a TMD can have one or multiple features as disclosed herein, or as recognized by those skilled in the art. Some examples can include the spring as a thin plate that acts as a flexure when it bends out of plane, with its outer perimeter clamped by the primary structure and the mass(es) located near its center. The flexure-type spring configurations can comprise a thin, circular member (or any other shape), which can be either solid or can contain one or more cutouts or apertures. The flexure-type springs can be planar or nonplanar to provide the required stiffness. Various cutouts can be included to provide the required stiffness and damping combination. One example, depicted in FIGS. 6A and 6B, represents a flexure type spring 604 having a solid, planar configuration. Another example, depicted in FIGS. 6C and 6D, represents a flexure type spring 608 having a solid, nonplanar configuration (see series of radial protrusions 609 and recesses 611 forming a series of radial corrugations). Yet another example, depicted in FIG. 6E, represents a flexure type spring 612 having a planar configuration with a plurality of cutout orifices or apertures 614 of any size/shape. Still another example, depicted in FIG. 6F, represents a flexure type spring 616 having a planar configuration with a plurality of oblong cutouts or apertures 618, sized and shaped to resemble a spoke or spoke-like pattern. Still another example, depicted in FIG. 6G, represents a flexure type spring 620 having a planar configuration with a plurality of oblong helical or spiraling cutouts or apertures 622 that are curved as they traverse radially out from the center. Any of these features can manifest themselves in various shapes, numbers, patterns, arrangements and sizes, with the goal of providing the requisite combination of stiffness and damping properties for the TMD to dynamically behave as needed. Indeed, those skilled in the art will recognize that the properties of a TMD can be designed and optimized for a particular use or application by utilizing different spring, mass configurations. The dotted lines in each of FIGS. 6A-6G represent an example location of a mass (not shown, but the same or similar to those described herein) of the TMD that is configured to engage, interface or otherwise be operable with the respective springs 604, 608, 612, 616 and 620.

It is to be understood that the examples of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular examples only and is not intended to be limiting.

Furthermore, the described features, structures, or characteristics may be combined in any suitable manner in one or more examples. In the description, numerous specific details are provided, such as examples of lengths, widths, shapes, etc., to provide a thorough understanding of examples of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. An electronics module comprising:
    an electronics component;
    a heatsink mounted external to the electronics component for cooling the electronics component, the heatsink comprising at least one facesheet and a fluid reservoir at least partially defined by the facesheet;
    a tuned mass damper (TMD) mounted within the fluid reservoir of the heatsink, the TMD leveraging viscous properties of fluid within the fluid reservoir to attenuate excitations within the electronics module as propagated through the electronics module.

2. The electronics module of claim 1, wherein the fluid reservoir comprises a primary fluid flow path and a secondary fluid flow path in fluid communication with the primary fluid flow path, and wherein the TMD is located in one of the primary fluid flow path and the secondary fluid flow path.

3. The electronics module of claim 1, wherein the fluid reservoir comprises a self-contained fluid volume.

4. The electronics module of claim 1, further comprising a plurality of TMDs mounted to the heatsink within the fluid reservoir proximate, wherein at least of the plurality of TMDs is mounted proximate an antinode.

5. The electronics module of claim 1, wherein the TMD is located within a primary fluid flow path.

6. The electronics module of claim 1, wherein the TMD is completely sealed.

7. The electronic module of claim 1, wherein the TMD is oriented transverse to the fluid flow in any degree of inclination.

8. The electronic module of claim 1, wherein the TMD is oriented such that it exhibits maximum displacement along an axis normal to a major plane of the electronic module, which axis is orthogonal to the fluid flow direction.

9. The electronic module of claim 1, wherein the TMD comprises:
    a mass;
    a spring operably connected to the mass; and
    a fluid resistance feature facilitating fluid flow about the mass and the spring for damping.

* * * * *